(12) United States Patent (10) Patent No.: US 11,996,319 B2
Zhang et al. (45) Date of Patent: May 28, 2024

(54) MANUFACTURING METHOD OF AIR BRIDGE, AIR BRIDGE AND ELECTRONIC DEVICE

(71) Applicant: Tencent Technology (Shenzhen) Company Limited, Guangdong (CN)

(72) Inventors: Wenlong Zhang, Shenzhen (CN); Chuhong Yang, Shenzhen (CN); Shengyu Zhang, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 129 days.

(21) Appl. No.: 17/505,294

(22) Filed: Oct. 19, 2021

(65) Prior Publication Data

US 2022/0157646 A1 May 19, 2022

Related U.S. Application Data

(63) Continuation of application No. PCT/CN2021/102878, filed on Jun. 28, 2021.

(30) Foreign Application Priority Data

Nov. 17, 2020 (CN) .......................... 202011288110.4

(51) Int. Cl.
*H01L 21/764* (2006.01)
*H01L 23/66* (2006.01)
*H01L 29/06* (2006.01)

(52) U.S. Cl.
CPC ............ *H01L 21/764* (2013.01); *H01L 23/66* (2013.01); *H01L 29/0649* (2013.01); *H01L 2223/66* (2013.01)

(58) Field of Classification Search
CPC ... H01L 21/764; H01L 23/66; H01L 23/4821; H01L 29/0649; H01L 2223/66
See application file for complete search history.

(56) References Cited

U.S. PATENT DOCUMENTS

| 5,308,440 A | 5/1994 | Chino et al. |
| 5,408,742 A | 4/1995 | Zaidel et al. |

(Continued)

FOREIGN PATENT DOCUMENTS

| CN | 101276778 A | 10/2008 |
| CN | 104075811 A | 10/2014 |

(Continued)

OTHER PUBLICATIONS

Search Report for CN 202011288110.4 dated Dec. 21, 2020, 3p, in Chinese language.

(Continued)

*Primary Examiner* — Dao H Nguyen
(74) *Attorney, Agent, or Firm* — Crowell & Moring LLP

(57) ABSTRACT

A method for manufacturing an air bridge, an air bridge, and an electronic device are disclosed. The method for manufacturing an air bridge includes: applying a first photoresist layer to a substrate; applying a second photoresist layer to the first photoresist layer; exposing, developing, and fixing the second photoresist layer, to form a patterned structure; etching away the first photoresist layer in a specified area through the patterned structure, to form a structure for blocking a deposition material from diffusing to a periphery on the substrate, the specified area including a projection area formed on the first photoresist layer by a top opening of the patterned structure; and depositing a bridge support structure on a surface of the substrate exposed after the first photoresist layer in the specified area is etched away, and forming an air bridge based on the bridge support structure.

11 Claims, 3 Drawing Sheets

(56) References Cited

U.S. PATENT DOCUMENTS

| | | |
|---|---|---|
| 5,686,743 A | 11/1997 | Lammert |
| 5,817,446 A * | 10/1998 | Lammert ............ H01L 21/7682 |
| | | 430/315 |
| 6,037,245 A | 3/2000 | Matsuda |
| 10,453,778 B1 * | 10/2019 | Holmes ............... H01L 23/4821 |
| 2005/0011673 A1 | 1/2005 | Wong et al. |
| 2008/0261155 A1 * | 10/2008 | Borzenko ........... H01L 21/7682 |
| | | 430/311 |
| 2014/0291740 A1 | 10/2014 | Simin et al. |
| 2022/0037148 A1 * | 2/2022 | Zhang ..................... G03F 7/095 |

FOREIGN PATENT DOCUMENTS

| | | |
|---|---|---|
| CN | 112103241 A | 12/2020 |
| EP | 0818816 A1 | 1/1998 |
| JP | 1997-270464 | 10/1997 |
| JP | H 9-270464 A | 10/1997 |
| JP | H 165006 A | 3/1998 |
| JP | 2000-022131 A | 1/2000 |
| JP | 2007-536747 | 12/2007 |

OTHER PUBLICATIONS

First Office Action for Chinese application No. 202011288110.4 dated Dec. 29, 2020 3p, in Chinese language.

International Search Report and Written Opinion for priority application No. PCT/CN2021/102878 dated Sep. 28, 2021, 9p, in Chinese language.

Concise Explanation of Relevance.

Office Action for corresponding Japanese application No. 2021-564818 dated Feb. 16, 2020, 6p, in Japanese language.

Concise Esplanation of Relevancy.

Extended European Search Report for EP application No. 21791237.7 dated Jun. 7, 2022, 8p.

Office Action for Korean application No. 10-2021-7038831 dated Dec. 12, 2022, 4p, in Korean language.

English language translation of Office Action for Korean application No. 10-2021-7038831 dated Dec. 12, 2022, 3p.

* cited by examiner

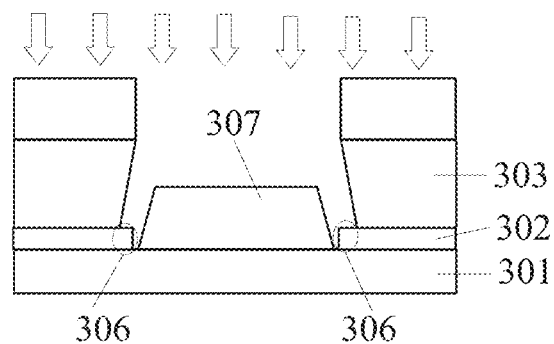
FIG. 7
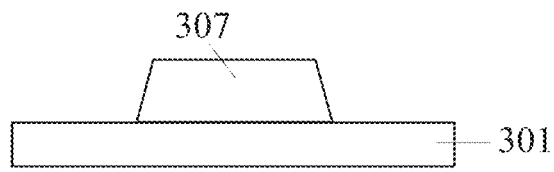
FIG. 8
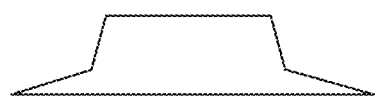   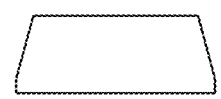
FIG. 9A              FIG. 9B
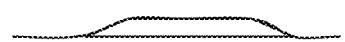   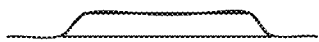
FIG. 10A             FIG. 10B

MANUFACTURING METHOD OF AIR BRIDGE, AIR BRIDGE AND ELECTRONIC DEVICE

RELATED APPLICATION

This application is a continuation of PCT Application No. PCT/CN2021/102878, filed Jun. 28, 2021, which claims priority to Chinese Patent Application No. 202011288110.4, filed on Nov. 17, 2020, The above applications are incorporated by reference in their entireties.

TECHNICAL FIELD

This application relates to the field of semiconductor, superconductor, quantum, and nanofabrication technologies, and in particular, to a method for manufacturing an air bridge, an air bridge, and an electronic device.

BACKGROUND

In high frequency and ultra-high frequency devices, it is necessary to reduce parasitic capacitance of a metal electrode lead to improve the sensitivity of the devices. Because the value of the dielectric constant of air is close to 1, when the metal electrode lead is implemented by using an air bridge method, the parasitic capacitance can be greatly reduced, and a process procedure of using a low-dielectric-constant dielectric film material of which the deposition is expensive. In addition, an air bridge structure provides a low thermal resistance connection and a heat dissipation channel for the electrode lead.

An air bridge is a circuit structure, which is an approach to implement cross-connection of planar circuits by a three-dimensional bridge structure. Because a medium between the bridge and the circuit is air (or vacuum), the medium is referred to as an air bridge or a vacuum bridge. A bridge support angle of the air bridge determines the stability of the air bridge. However, no solution for effectively adjusting a bridge support angle of an air bridge is provided in the related art.

SUMMARY

Embodiments of this disclosure provide a method for manufacturing an air bridge, an air bridge, and an electronic device, which can implement effective control and adjustment of a bridge support angle of an air bridge.

The embodiments of this disclosure provide a method for manufacturing an air bridge, including: applying a first photoresist layer to a substrate; applying a second photoresist layer to the first photoresist layer; exposing, developing, and fixing the second photoresist layer, to form a patterned structure; etching away the first photoresist layer in a specified area through the patterned structure, to form a structure for blocking a deposition material from diffusing to a periphery on the substrate, the specified area including a projection area formed on the first photoresist layer by a top opening of the patterned structure; and depositing a bridge support structure on a surface of the substrate exposed after the first photoresist layer in the specified area is etched away, and forming the air bridge based on the bridge support structure.

The embodiments of this disclosure further provide an air bridge, the air bridge being manufactured by using the method for manufacturing an air bridge provided in the embodiments of this disclosure.

The embodiments of this disclosure further provide an electronic device, the electronic device including an air bridge manufactured by using the method for manufacturing an air bridge provided in the embodiments of this disclosure.

The embodiments of this disclosure provide an electronic component, comprising: a substrate; a first photoresist layer on the substrate; a second photoresist layer on the first photoresist layer; and a bridge support structure formed on the substrate within an opening of the first photoresist layer, wherein a thickness of the first photoresist layer and a height of the bridge support structure satisfy the following conditions:

$$5h \leq H \leq 6h,$$

wherein h represents the thickness of the first photoresist layer; and H represents the height of the bridge support structure.

An application of the embodiments of this disclosure may have the following beneficial technical effects:

A first photoresist layer and a second photoresist layer are sequentially applied to a substrate, and the second photoresist layer is then exposed, developed, and fixed, to form a patterned structure for depositing a bridge support on the second photoresist layer, so as to etch away the first photoresist layer in a specified area through the patterned structure. Because the specified area includes a projection area formed on the first photoresist layer by a top opening of the patterned structure, during deposition of a bridge support structure on a surface of the substrate exposed after the first photoresist layer in the specified area is etched away, the first photoresist layer that has not been etched away can block a deposition material from diffusing to a periphery, and a degree of etching (such as an etching range) of the first photoresist layer in the projection area can also affect a blocking procedure of the deposition material, so as to implement effective control and adjustment of a bridge support angle of an air bridge.

BRIEF DESCRIPTION OF THE DRAWINGS

FIG. 3 to FIG. 8 are schematic diagrams of a process of manufacturing an air bridge according to an embodiment of this disclosure.

FIGS. 9A and 9B are schematic diagrams comparing bridge support angles of a bridge support structure manufactured by using a manufacturing method in an embodiment of this disclosure and a bridge support structure manufactured in the related art according to an embodiment of this disclosure.

FIGS. 10A and 10B are schematic diagrams comparing bridge support angles of bridge support structures manufactured with different durations of etching a primer according to an embodiment of this disclosure.

DETAILED DESCRIPTION

Exemplary implementations will now be described more thoroughly with reference to the accompanying drawings. However, the exemplary implementations may be implemented in various forms, and are not to be understood as being limited to the examples described herein. Instead, the implementations are provided to make this disclosure more thorough and complete and fully convey the idea of the exemplary implementations to a person skilled in the art.

In addition, the described features, structures or characteristics may be combined in one or more embodiments in any appropriate manner. In the following descriptions, a lot of specific details are provided to give a comprehensive understanding of the embodiments of this disclosure. However, a person of ordinary skill in the art is to be aware that, the technical solutions in this disclosure may be implemented without one or more of the particular details, or another method, unit, apparatus, or step may be used. In other cases, well-known methods, apparatuses, implementations, or operations are not shown or described in detail, in order not to obscure the aspects of this disclosure.

The flowcharts shown in the accompanying drawings are merely exemplary descriptions, do not need to include all content and operations/steps, and do not need to be performed in the described orders either. For example, some operations/steps may be further divided, while some operations/steps may be combined or partially combined. Therefore, an actual execution order may change according to an actual case.

Note that "Plurality of" mentioned in the specification means two or more. "And/or" describes an association relationship for associated objects and represents that three relationships may exist. For example, A and/or B may represent the following three cases: only. A exists, both A and B exist, and only B exists. The character "/" in this specification generally indicates an "or" relationship between the associated objects.

In the following descriptions, related "some embodiments" describe a subset of all possible embodiments. However, it may be understood that the "some embodiments" may be the same subset or different subsets of all the possible embodiments, and may be combined with each other without conflict.

In the related art, there are usually two solutions of manufacturing an air bridge. In one solution, an air bridge is based on a bridge support made of photoresist. In the other solution, an air bridge is based on a bridge support made of a releasable deposition material (which is usually silicon dioxide). For the air bridge based on a bridge support made of photoresist, the shape of a bridge may be changed by heating reflux. The shape of a bridge arch is usually improved. The bridge arch of the air bridge using this manufacturing solution is relatively stable.

Figure 1:
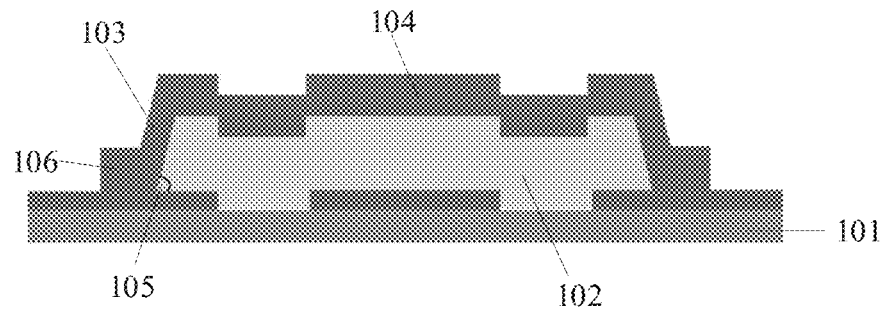
FIG. 1 is a schematic structural diagram of an air bridge according to an embodiment of this disclosure.

Because the air bridge based on a bridge support made of a releasable deposition material has a shape the same as that of the bridge support, and with additional restriction by a coating process, the air bridge is usually trapezoidal. In an air bridge structure shown in FIG. 1, after a bridge support 102 is released, except for a bridge pier 106 that is connected to a circuit structure on a substrate 101, all the remaining part is suspended in air. The shape of the air bridge is a factor to the stability of the remaining part. Due to different bridge support angles 105, the trapezoidal shape of a trapezoidal bridge varies greatly. However, the bridge support angle determines an approach angle (an angle between an approach 103 and the bridge pier 106). It is generally considered that the bridge support angle 105 is equal to the approach angle. If the approach angle is excessively small, a bridge top 104 is prone to collapse. If the approach angle is excessively large, a part of the approach tends to be very thin due to particular directionality during evaporation coating, to cause a fracture at the approach. Therefore, generally, the trapezoidal bridge with the approach angle being a tilt of 35° to 50° is the most stable. Therefore, modifying the bridge support angle 105 may increase the stability of the air bridge.

A coating process such as deposition and evaporation of manufacturing a bridge support usually starts to be taken into consideration to adjust the bridge support angle. Various parameters such as temperature, speed, and vacuum degree during the coating are changed. If process parameters of the coating are fixed or adjustable ranges are restricted, it is difficult to adjust the bridge support angle of the air bridge. To make a great change to the bridge support angle, an additional part such as a sample pan water cooling system and an infrared heating and baking system usually needs to be added to a device. These systems often conflict with an original design on a molding device, resulting in difficulty in addition. It can be seen that the cost of retrofitting the device for improving the bridge support angle in the related art is very high. It is difficult for a mature operating device to meet an improvement requirement, and the device may have an irreversible impact on stable process parameters.

Figure 2:
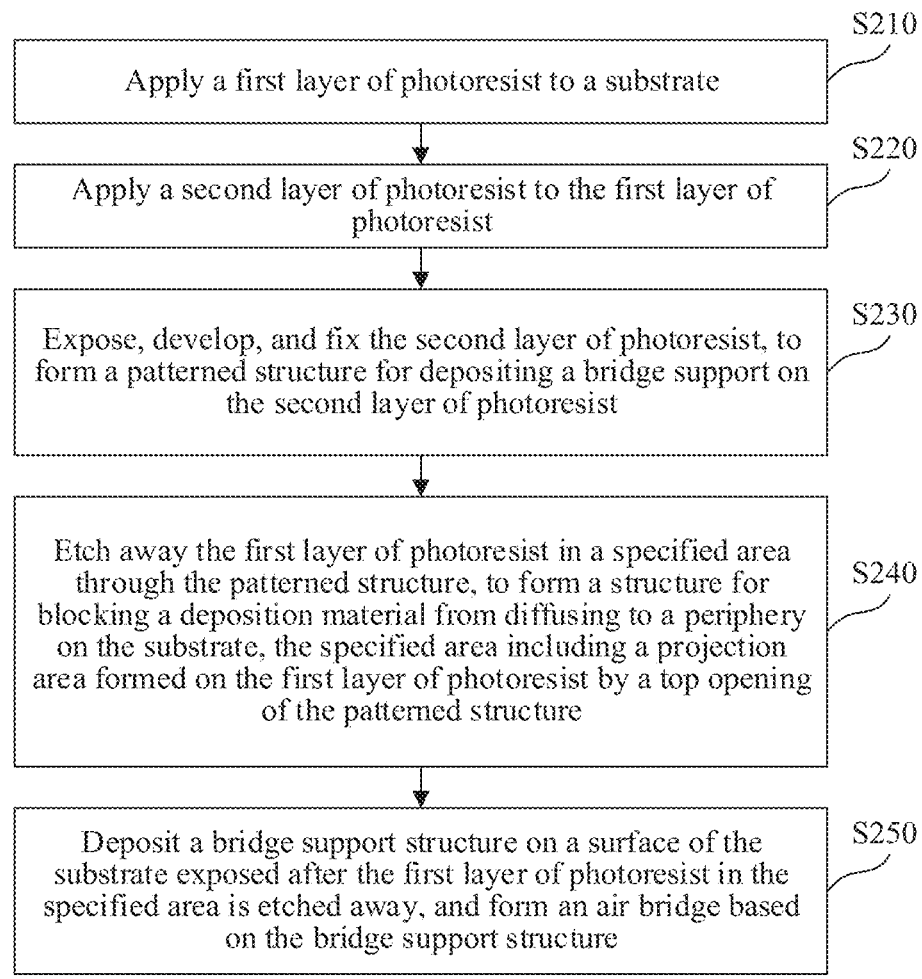
FIG. 2 is a flowchart of a method for manufacturing an air bridge according to an embodiment of this disclosure.

Based on the above, the embodiments of this disclosure provide a new method for manufacturing an air bridge. Referring to FIG. 2, the method includes the following steps:

Step S210: Apply a first photoresist layer to a substrate.

Step S220: Apply a second photoresist layer to the first photoresist layer.

Step S230: Expose, develop, and fix the second photoresist layer, to form a patterned structure for depositing a bridge support on the second photoresist layer.

Step S240: Etch away the first photoresist layer in a specified area through the patterned structure, to form a structure for blocking a deposition material from diffusing to a periphery on the substrate, the specified area including a projection area formed on the first photoresist, layer by a top opening of the patterned structure.

Step S250: Deposit a bridge support structure on a surface of the substrate exposed after the first photoresist layer in the specified area is etched away, and form an air bridge based on the bridge support structure.

The manufacturing method shown in FIG. 2 is described in detail below with reference to FIG. 3 to FIG. 8.

Figure 3:
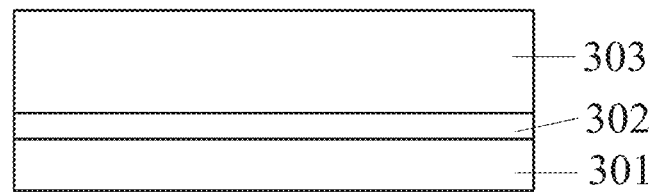

As shown in FIG. 3, 301 is a substrate. In step S210, a first photoresist layer 302 is applied to the substrate 301. In step S220, a second photoresist layer 303 is applied to the first photoresist layer 302.

In an embodiment of this disclosure, after the first photoresist layer 302 is applied to the substrate, a first baking may be performed on the first photoresist layer 302, to solidify the first photoresist layer 302 on the substrate 301 as soon as possible. After the first photoresist layer 302 is solidified on the substrate 301, the second photoresist layer 303 is applied to the first photoresist layer 302. After the second photoresist layer 303 is applied, a second baking may be performed on the second photoresist layer 303. In some embodiments, a temperature of the second baking is less than or equal to a temperature of the first baking.

In some embodiments, the first photoresist layer 302 may be polymethyl methacrylate (PMMA). The second photoresist layer 303 may be an AZ negative photoresist.

Figure 4:
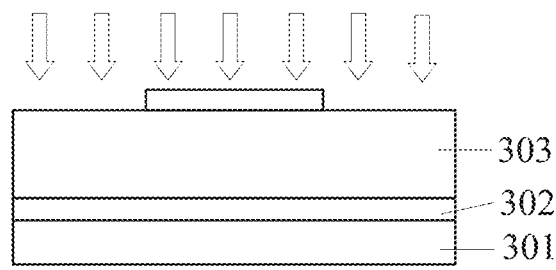
Figure 5:
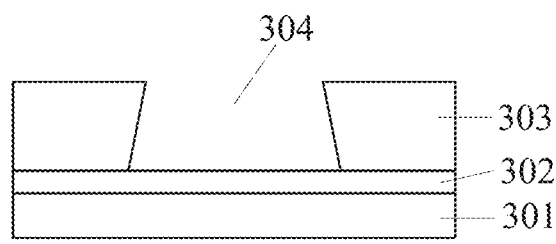

In an embodiment of this disclosure, as shown in FIG. 4, after the second photoresist layer 303 is formed, the second photoresist layer 303 is exposed as a pattern defining layer. After the exposure, as shown in FIG. 5, the exposed second photoresist layer 303 is developed and fixed, to form a patterned structure 304 for depositing a bridge support on the second photoresist layer 303.

In an embodiment of this disclosure, the second photoresist layer 303 may be exposed through ultraviolet exposure or direct laser writing.

In an embodiment of this disclosure, to avoid affecting the first photoresist layer 302 during the development of the second photoresist layer 303, a developer used for developing the second photoresist layer 303 may be a developer that do not cause a physical reaction or a chemical reaction with the first photoresist layer 302, so that the developer only develops the second photoresist layer 303.

Figure 6:
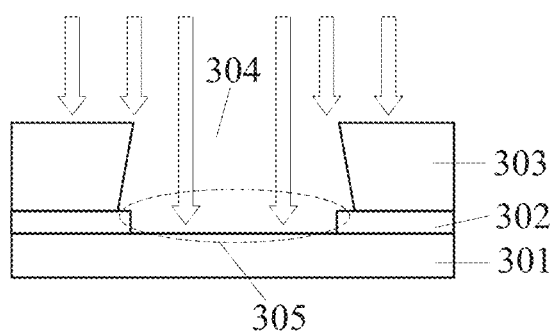

In an embodiment of this disclosure, after the patterned structure 304 for depositing a bridge support is formed on the second photoresist layer 303, as shown in FIG. 6, the first photoresist layer in a specified area 305 can be etched away through the patterned structure 304, to form a structure (for clarity, refer to 306 in FIG. 7 for the structure) for blocking a deposition material from diffusing to a periphery on the substrate 301. The specified area 305 includes a projection area formed on the first photoresist layer 302 by a top opening of the patterned structure 304. In some embodiments, the specified area 305 may be the entire projection area, or the specified area 305 may be slightly larger than the projection area.

In an embodiment of this disclosure, a width of a bottom of the patterned structure 304 may be greater than a width of the top opening of the patterned structure 304, the bottom of the patterned structure 304 being in contact with or approximate to the first photoresist layer 302. In this case, even if the entire first photoresist layer in the foregoing projection area is etched away, the surface of the substrate 301 may also form a structure protruding from the bottom of the patterned structure 304, to block the deposition material during deposition of the bridge support structure. In some embodiments, a cross-section of the patterned structure 304 may be a regular trapezoid.

In an embodiment of this disclosure, after the first photoresist layer in the specified area 305 is etched away, as shown in FIG. 7, a bridge support structure 307 is deposited on a surface of the exposed substrate, to form an air bridge based on the bridge support structure 307. In some embodiments, a material of the bridge support structure 307 may be silicon dioxide.

In an embodiment of this disclosure, a thickness of the first photoresist layer 302 affects a height of the bridge support structure 307 that needs to be deposited. In practical implementation, the thickness of the first photoresist layer 302 and the height of the bridge support structure 307 to be deposited satisfy the following conditions:

$$5h \leq H \leq 6h,$$

where h represents the thickness of the first photoresist layer 302; and H represents the height of the bridge support structure 307 to be deposited.

In an embodiment of this disclosure, the second photoresist layer 303 and the first photoresist layer 302 on the substrate 301 may be removed after the bridge support structure 307 is deposited, to obtain the structure shown in FIG. 8. Then overlaying and metal deposition may be performed on the structure based on FIG. 8, to form the air bridge.

In an embodiment of this disclosure, after the second photoresist layer 303 and the first photoresist layer 302 on the substrate are removed, the substrate (that is, the structure shown in FIG. 7) formed with the bridge support structure 307, the first photoresist layer 302, and the second photoresist layer 303 may be placed in a photoresist stripping solution, to remove the second photoresist layer 303 and the first photoresist layer 302.

In an embodiment of this disclosure, if the photoresist stripping solution for the first photoresist layer 302 is the same as the photoresist stripping solution for the second photoresist layer 303, the structure shown in FIG. 7 may be directly placed in the same photoresist stripping solution. If the photoresist stripping solution for the first photoresist layer 302 is different from the photoresist stripping solution for the second photoresist layer 303, the structure shown in FIG. 7 is first placed in the photoresist stripping solution for the second photoresist layer 303. After the second photoresist layer 303 is removed, the substrate formed with the bridge support structure and the first photoresist layer 302 is placed in the photoresist stripping solution for the first photoresist layer 302.

In an embodiment of this disclosure, the bridge support angle obtained based on the technical solution in the embodiments of this disclosure is related to a position where the deposition material contacts the structure 306 when the deposition material diffuses, and is also related to a size of the opening formed through etching in the first photoresist layer 302. In practical implementation, when the opening is larger (that is, the structure 306 protrudes less), the bridge support angle is smaller. Conversely, when the opening is smaller (that is, the structure 306 protrudes more), the bridge support angle is larger. The size of the opening in the first photoresist layer 302 is related to an etching duration, that is, when the etching duration is longer, the opening is larger. When the etching duration is shorter, the opening is smaller. Therefore, the bridge support angle may be modified by controlling the duration of etching the first photoresist layer 302. In practical implementation, when the etching duration of the first photoresist layer 302 is longer, the eventually obtained bridge support angle is smaller. Conversely, when the etching duration of the first photoresist layer 302 is shorter, the eventually obtained bridge support angle is larger.

In some embodiments, the method for manufacturing an air bridge may include the following steps:

Step S1: Spin-coat PMMA on the substrate as a primer (the primer is the first photoresist layer), and bake the primer at 180° C. for a period of time.

Step S2: Spin-coat an AZ negative photoresist on the primer (that is, the second photoresist layer), and bake the primer at 95° C. for a period of time, Step S3: Perform ultraviolet exposure and pre-baking on the AZ negative photoresist, and then perform flood exposure, development, and fixing, to obtain a photoresist structure used for depositing and stripping the bridge support (that is, to obtain a patterned structure).

Step S4: Etch the primer by using oxygen plasma for a period of time, to make the primer form an opening similar in size to the patterned structure for deposition.

Step S5: Perform electron beam evaporation of silicon dioxide for use as the bridge support;

Step S6: Place a sample in acetone (that is, the photoresist stripping solution) to strip the AZ negative photoresist and the primer, to obtain the bridge support structure on the substrate; and Step S7: Perform overlaying on the obtained sample of the bridge support structure, and perform electron beam evaporation of aluminum, to eventually obtain the air bridge.

As shown in FIGS. 9A and B, compared with the bridge support structure (as shown in FIG. 9A manufactured in the related art, the bridge support structure manufactured by using the manufacturing method in the embodiments of this disclosure is shown in FIG. 9B, in which apparently the bridge support angle can be appropriately modified, and the bridge support angle can be increased, to make the bridge support angle in a state that ensures the stability of the air bridge. In practical implementation, the bridge support angle of the bridge support structure manufactured by using the manufacturing method in the embodiments of this disclosure may reach about 37°. However, the bridge support angle of the bridge support structure manufactured in the related art is only about 22°.

In an embodiment of this disclosure, in Step S4 in the foregoing embodiment, when the primer is etched by using the oxygen plasma, the etching duration also affects the final bridge support angle. As shown in FIGS. 10A and 10B, FIG. 10A shows the bridge support structure obtained with a longer etching duration, and FIG. 10B shows the bridge support structure obtained with a shorter etching duration. Obviously, the bridge support angle obtained in FIG. 10A is smaller than the bridge support angle obtained in FIG. 10B. That is, when the etching duration is longer, the bridge support angle of the obtained bridge support structure is smaller. In practical implementation, the bridge support angle obtained with a longer etching duration is about 18°, and the bridge support angle obtained with a shorter etching duration is about 34°. Therefore, in embodiments of this disclosure, the bridge support angle of the air bridge can be modified by controlling the etching duration of the primer, thereby implementing effective control and adjustment of a bridge support angle of an air bridge.

The air bridge manufactured by using the manufacturing method provided in the embodiments of this disclosure has high stability, and can be used in various electronic circuits and electronic devices, such as in high frequency and ultra-high frequency devices, thereby greatly improving the working stability of electronic devices. The air bridge may also be used in superconducting quantum chip circuits, to provide a stable air bridge structure.

After considering the specification and practicing the implementations of the present disclosure, a person skilled in the art may easily conceive of other implementations of this disclosure. This disclosure is intended to cover any variations, uses, or adaptive changes of this disclosure. These variations, uses, or adaptive changes follow the general principles of this disclosure and include common general knowledge or common technical means in the art, which are not disclosed in this disclosure.

It is to be understood that this disclosure is not limited to the precise structures described above and shown in the accompanying drawings, and various modifications and changes can be made without departing from the scope of this disclosure. The scope of this disclosure is subject only to the appended claims.

What is claimed is:

1. A method for manufacturing an air bridge, comprising:
applying a first photoresist layer to a substrate;
applying a second photoresist layer to the first photoresist layer;
exposing, developing, and fixing the second photoresist layer to form a patterned structure;
etching away the first photoresist layer in a specified area substantially defined by the patterned structure, to form a structure for blocking a deposition material from diffusing to a periphery on the substrate, the specified area comprising a projection area formed on the first photoresist layer by a top opening of the patterned structure;
depositing a bridge support structure on a surface of the substrate exposed after the first photoresist layer in the specified area is etched away; and
depositing the air bridge based on the bridge support structure.

2. The method according to claim 1, wherein after applying the first photoresist layer to the substrate, the method further comprises:
performing a first baking to the first photoresist layer; and
after applying the second photoresist layer to the first photoresist layer, the method further comprises:
performing a second baking to the second photoresist layer, a temperature of the second baking being less than or equal to a temperature of the first baking.

3. The method according to claim 1, wherein depositing the air bridge based on the bridge support structure comprises:
removing the second photoresist layer and the first photoresist layer on the substrate after the bridge support structure is deposited; and
performing overlaying and metal deposition on the surface of the substrate formed with the bridge support structure after the second photoresist layer and the first photoresist layer on the substrate are removed to form the air bridge.

4. The method according to claim 3, wherein removing the second photoresist layer and the first photoresist layer on the substrate comprises:
placing the substrate formed with the bridge support structure, the first photoresist layer, and the second photoresist layer in at least one type of photoresist stripping solution to remove the second photoresist layer and the first photoresist layer.

5. The method according to claim 4, wherein
a first type of photoresist stripping solution for the first photoresist layer is different from a second type of photoresist stripping solution for the second photoresist layer, and
placing the substrate formed with the bridge support structure, the first photoresist layer, and the second photoresist layer in at least one type of photoresist stripping solution comprising:
first placing the substrate formed with the bridge support structure, the first photoresist layer, and the second photoresist layer in the second type of photoresist stripping solution for the second photoresist layer; and
after the second photoresist layer is removed, placing the substrate formed with the bridge support structure and the first photoresist layer in the first type of photoresist stripping solution for the first photoresist layer.

6. The method according to claim 1, wherein the step of exposing, developing, and fixing the second photoresist layer comprises performing ultraviolet exposure or direct laser writing.

7. The method according to claim 1, wherein a thickness of the first photoresist layer and a height of the bridge support structure satisfy the following conditions:

$$5h \leq H \leq 6h$$

wherein h represents the thickness of the first photoresist layer; and H represents the height of the bridge support structure.

8. The method according to claim 1, further comprising:
controlling a bridge support angle of the bridge support structure obtained through deposition on the surface of the substrate by controlling an etching duration of the first photoresist layer through the patterned structure, wherein the etching duration of the first photoresist layer through the patterned structure is in an inverse relationship with the bridge support angle of the bridge support structure.

9. The method according to claim 1, wherein a width of a bottom of the patterned structure is greater than a width of the top opening of the patterned structure, the bottom of the patterned structure being in contact with the first photoresist layer.

10. The method according to claim 9, wherein a cross-section of the patterned structure is a regular trapezoid.

11. The method according to claim 1, wherein the step of exposing, developing, and fixing the second photoresist layer to form the patterned structure comprises using a developer in the development of the second photoresist layer, the developer being incapable to cause a physical reaction or a chemical reaction to the first photoresist layer.

* * * * *